(12) United States Patent
Hendrickson

(10) Patent No.: US 9,025,381 B2
(45) Date of Patent: May 5, 2015

(54) BLOCK-ROW DECODERS, MEMORY BLOCK-ROW DECODERS, MEMORIES, METHODS FOR DESELECTING A DECODER OF A MEMORY AND METHODS OF SELECTING A BLOCK OF MEMORY

(71) Applicant: Micron Technology, Inc., Boise, ID (US)

(72) Inventor: Nicholas Hendrickson, Lakeville, MN (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/148,982

(22) Filed: Jan. 7, 2014

(65) Prior Publication Data

US 2014/0119149 A1    May 1, 2014

Related U.S. Application Data

(63) Continuation of application No. 13/168,699, filed on Jun. 24, 2011, now Pat. No. 8,625,382.

(51) Int. Cl.
| | |
|---|---|
| *G11C 11/34* | (2006.01) |
| *G11C 8/10* | (2006.01) |
| *G11C 8/08* | (2006.01) |
| *G11C 8/12* | (2006.01) |

(52) U.S. Cl.
CPC .. *G11C 8/10* (2013.01); *G11C 8/08* (2013.01); *G11C 8/12* (2013.01)

(58) Field of Classification Search
CPC .......... G11C 7/1039; G11C 8/08; G11C 8/10; G11C 11/4085

USPC ............... 365/185.12, 230.03, 230.06
See application file for complete search history.

(56) References Cited

U.S. PATENT DOCUMENTS

| | | | |
|---|---|---|---|
| 6,711,058 B1 * | 3/2004 | Hirano | 365/185.11 |
| 7,023,750 B2 | 4/2006 | Aakjer | |
| 7,032,083 B1 * | 4/2006 | Jensen et al. | 711/154 |
| 7,177,201 B1 | 2/2007 | Takayanagi | |
| 7,675,317 B2 | 3/2010 | Perisetty | |
| 2008/0159053 A1 | 7/2008 | Yan et al. | |
| 2009/0080256 A1 | 3/2009 | Lee et al. | |
| 2009/0273984 A1 | 11/2009 | Tanzawa | |
| 2011/0090739 A1 | 4/2011 | Goda et al. | |
| 2012/0195142 A1 | 8/2012 | Lee et al. | |
| 2012/0327735 A1 | 12/2012 | Hendrickson | |

* cited by examiner

*Primary Examiner* — Han Yang
(74) *Attorney, Agent, or Firm* — Dorsey & Whitney LLP

(57) ABSTRACT

Block-row decoders, memory block-row decoders, memories, methods for deselecting a decoder of a memory and methods of selecting a block of memory are disclosed. An example memory block-row decoder includes a plurality of block-row decoders, each of the block-row decoders having a decoder switch tree. Each block-row decoder is configured to bias a block select switch of the decoder switch tree with a first voltage while the block-row decoder is deselected and further configured to bias decoders switches of the decoder switch tree that are coupled to the block select switch with a second voltage while the block-row decoder is deselected, the second voltage less than the first voltage. An example method of deselecting a decoder of a memory includes providing decoder signals having different voltages to decoder switches from at least two different levels of a decoder switch tree while the decoder is deselected.

16 Claims, 4 Drawing Sheets

US 9,025,381 B2

BLOCK-ROW DECODERS, MEMORY BLOCK-ROW DECODERS, MEMORIES, METHODS FOR DESELECTING A DECODER OF A MEMORY AND METHODS OF SELECTING A BLOCK OF MEMORY

CROSS-REFERENCE TO RELATED APPLICATION

This application is a continuation of U.S. patent application Ser. No. 13/168,699, filed Jun. 24, 2011, U.S. Pat. No. 8,625,382 issued on Jan. 7, 2014. This application is incorporated by reference herein in its entirety and for all purposes.

TECHNICAL FIELD

Embodiments of the present invention relate generally to semiconductor memories, and more specifically in one or more of the illustrated embodiments, to biasing block-row decoders for deselected memory blocks of a memory.

BACKGROUND OF THE INVENTION

Data in electronic circuits may be stored in memory, for example, semiconductor memory. Examples of semiconductor memory include volatile memory, which is limited to storing data while power is provided to the memory, and non-volatile memory, which can store data even when power is no longer provided to the memory. Non-volatile memories have become more popular as mobile and compact electronic devices, for example, mobile phones, digital cameras, portable computers, and other such devices, require storage of information even after the electronic device is switched off.

Memory typically includes an array of memory cells which are used to store data. The memory cells are arranged in the array in a manner which can be addressed using memory addresses. The memory addresses are provided to the memory and decoded by address decoders to select a memory location or locations corresponding to a memory address. In operating the address decoders, the memory locations corresponding to the memory address are selected while the remaining memory locations remain deselected in order to preserve the data stored by the deselected memory locations.

In decoding memory addresses, circuitry included in the address decoders are operated by biasing the various circuitry, for example, decoders switches, to different voltages. For example, voltages are provided to close decoder switches coupled to memory locations to be accessed while decoder switches coupled to deselected memory locations are biased to remain open. The voltages applied to the decoder circuitry over time may degrade their performance, and in extreme cases, cause the circuitry to fail such as due to voltage induced stresses. In these cases where the decoder circuitry fails, the memory may become non-functional.

Therefore, it is desirable to have alternative designs for decoder circuitry and alternative methods for operating decoder circuitry.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
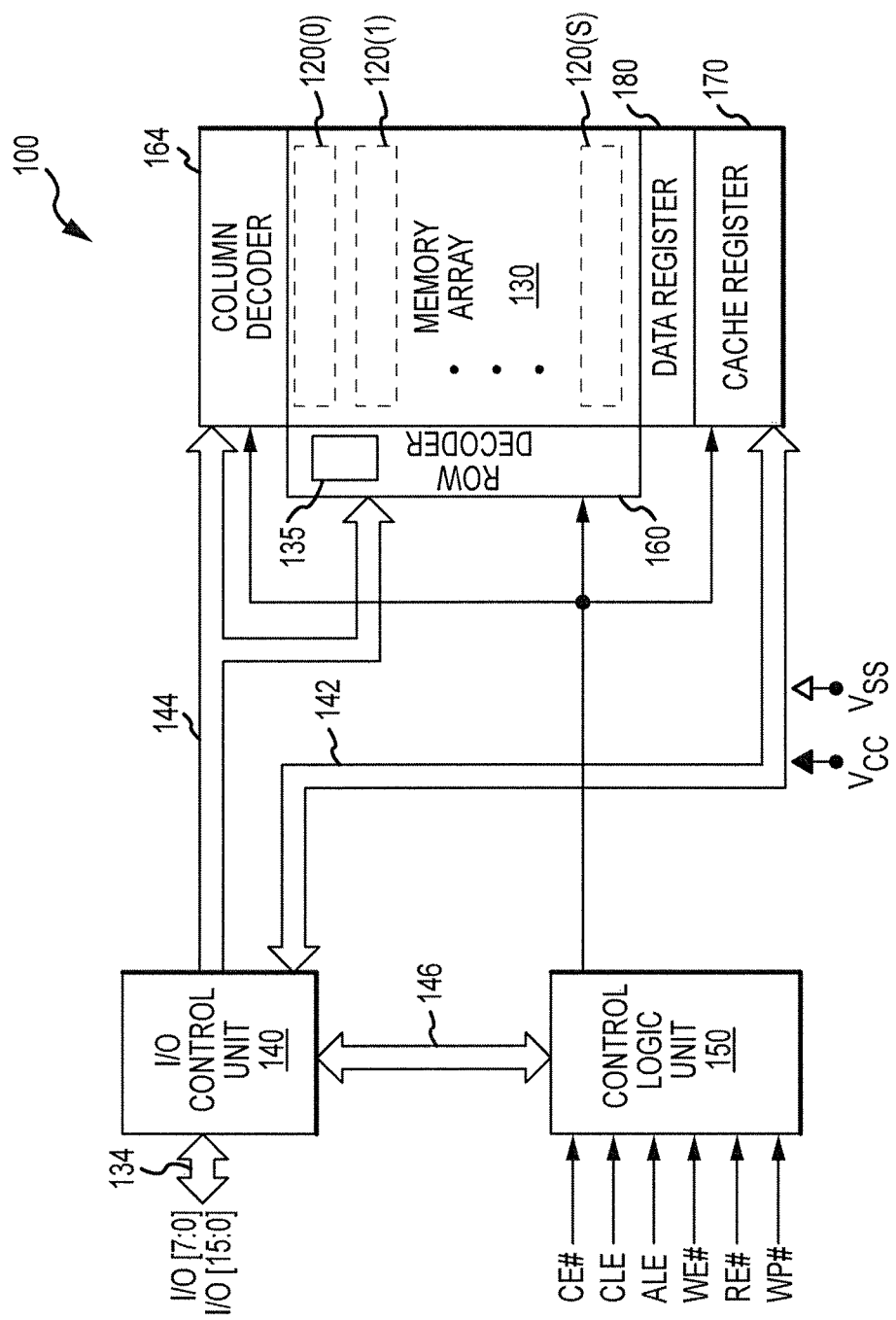
FIG. 1 is a simplified block drawing of a memory including a block-row decoder according to an embodiment of the invention.

FIG. 1 illustrates a memory 100 including a block-row decoder according to an embodiment of the invention. The memory 100 includes an array 130 of memory cells which may be arranged in blocks of memory 120(0)-120(S). Command signals, address signals and write data signals may be provided to the memory 100 as sets of sequential input/output ("I/O") signals transmitted through an I/O bus 134. Similarly, read data signals may be provided from the memory 100 through the I/O bus 134. The I/O bus is connected to an I/O control unit 140 that routes the signals between the I/O bus 134 and an internal data bus 142, an internal address bus 144, and an internal command bus 146. The memory 100 also includes a control logic unit 150 that receives a number of control signals either externally or through the command bus 146 to control the operation of the memory 100.

The address bus 144 provides block-row address signals to a memory block-row decoder 160 and column address signals to a column decoder 164. The memory block-row decoder 160 and column decoder 164 may be used to select memory cells for memory operations. The memory block-row decoder 160 includes block-row decoders 135 according to embodiments of the invention. Each of the block-row decoders 135 is associated with a respective one of the blocks of memory 120 and is configured to decode memory addresses for selecting a row of memory cells on which memory operations are performed, for example, erase, program, and read operations. The column decoder 164 enables write data signals to be applied to columns of memory corresponding to the column address signals and allow read data signals to be coupled from columns corresponding to the column address signals.

In response to the memory commands decoded by the control logic unit 150, the memory cells in the array 130 are erased, programmed, or read. After the block-row address signals have been provided on the address bus 144, the I/O control unit 140 routes write data signals to a cache register 170. The write data signals are stored in the cache register 170 in successive sets each having a size corresponding to the width of the I/O bus 134. The cache register 170 sequentially stores the sets of write data signals for an entire page (e.g. a row or part of a row of memory cells) of memory cells in the array 130. All of the stored write data signals are then used to program a of memory cells in the array 130 selected, at least in part, by the block-row address coupled through the address bus 144. In a similar manner, during a read operation, data signals from a row or block of memory cells selected, at least in part, by the block-row address provided on the address bus 144 are stored in a data register 180. Sets of data signals corresponding in size to the width of the I/O bus 134 are then sequentially transferred through the I/O control unit 140 from the data register 180 to the I/O bus 134.

Figure 2:
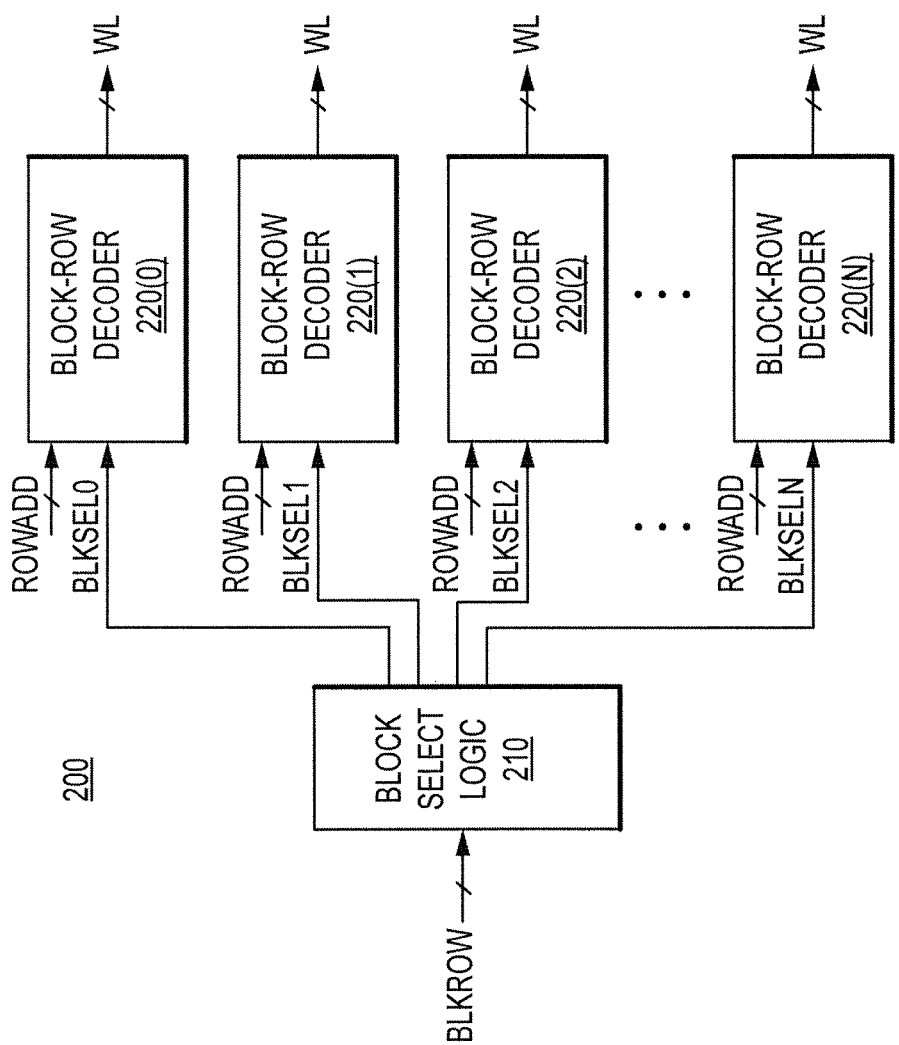
FIG. 2 is a simplified block drawing of a memory block-row decoder including block-row decoders according to an embodiment of the invention.

FIG. 2 illustrates a portion of a memory block row-decoder 200 according to an embodiment of the invention. The portion of the memory block-row decoder 200 may be included in the memory block-row decoder 160 of FIG. 1. Memory block select logic 210 included in the memory block-row decoder 200 is configured to receive block and row addresses BLKROW and select a block-row decoder 220(0)-220(N) based on the BLKROW addresses. The block select logic 210 provides an active block selection signal BLKSEL to select a block-row decoder 220 and provides inactive BLKSEL signals to maintain deselection of the other block-row decoders 220. The block-row decoders 220 are coupled to respective blocks of memory, for example, to memory cells of a respective block of memory through word lines WLs. The block-row decoders 220 are configured to provide signals to a respective block of memory to perform a requested memory operation for the memory corresponding to row memory addresses ROWADD when selected. In operation, the block select logic 210 decodes the BLKROW addresses to provide an active BLKSEL signal to select a memory block-row decoder 220 for a memory operation, for example, read, program, or erase operations. Other memory block-row decoders 220 remain deselected by an inactive BLKSEL signal provided by the block select logic 210. As will be described in more detail below, the deselected memory block-row decoders 220 are biased to prevent inadvertent memory access to the respective blocks of memory to which they are coupled.

Figure 3:
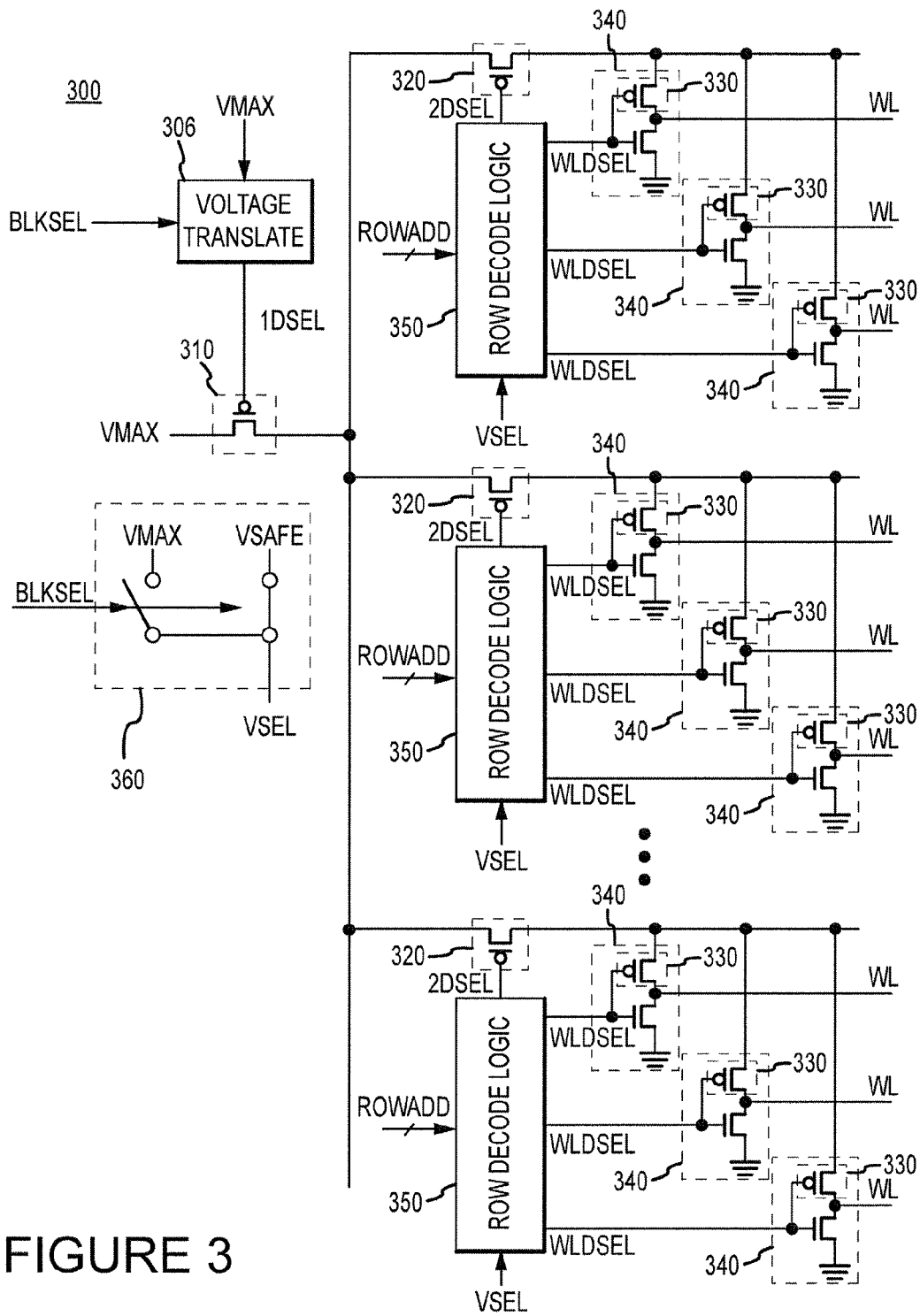
FIG. 3 is a schematic drawing of portions of a block-row decoder according to an embodiment of the invention.

FIG. 3 illustrates a portion of a block-row decoder 300 according to an embodiment of the invention. The portions of the block-row decoder 300 may be included in the block-row decoders 220 of the embodiment of FIG. 2. The block-row decoder 300 includes a first decoder switch 310 and further includes a voltage translator 306 configured to receive the BLKSEL signal and provide a first decoder select signal 1DSEL signal to the first decoder switch 310. As previously described, the BLKSEL signal may be provided by block select logic (e.g., block select logic 210 of FIG. 2). The voltage translator 306 is configured to provide a 1DSEL signal having a voltage of VMAX responsive to an inactive BLKSEL signal. The first decoder switch 310 is configured to selectively provide a voltage provided to its input based on the 1DSEL signal. The first decoder switch 310 may represent a block select switch which when closed (i.e., conductive) provides the voltage at its input to the rest of a tree of decoder switches of the block-row decoder. When the first decoder switch 310 is open (i.e., non-conductive) the rest of the tree of decoder switches is decoupled from receiving the input voltage. An active 1DSEL signal closes the first decoder switch 310 while an inactive 1DSEL signal opens the first decoder switch 310.

The first decoder switch 310 is coupled to second decoder switches 320, which are in turn coupled to a respective group of third decoder switches 330. The third decoder switches 330 may be included in word line drivers 340. The first, second, and third decoder switches may be p-channel field-effect transistors (pFETs) as illustrated for the embodiment of FIG. 3. Other circuits known to those ordinarily skilled in the art may be used for the first, second, and third decoders switches 310, 320, 330 as well. The word line drivers 340 are configured to drive respective word lines WLs to which they are coupled. As illustrated by FIG. 3, the second and third decoder switches 220 and 230 fanout from the first decoder switch 210 to provide a tree of decoder switches. The embodiment of FIG. 3 is illustrated as having an example fanout configuration, however, other fanout configurations may be used as well without departing from the scope of the invention.

Row decode logic 350 is configured to provide word line driver select signals WLDSEL to a respective group of word line drivers 340, and is further configured to provide second decoder switch select signals 2DSEL to respective second decoder switches 220. The WLDSEL and 2DSEL signals may be used to select WLs for memory operations based at least in part on ROWADD addresses provided to the row decode logic 350. For example, in a selected block-row decoder, the first, second and third decoder switches 310, 320, and 330 may be closed to couple a WL to the voltage provided to an input of the first decoder switch 310 (e.g., VMAX) to drive the WL. WLs not selected remain coupled to a reference voltage through respective word line drivers 340 as controlled by respective WLDSEL signals. In the event the block-row decoder 300 is deselected, the first, second, and third decoder switches 310, 320, 330 are controlled by the 1DSEL, 2DSEL and WLDSEL signals to remain open to prevent the voltage provided to the input of the first decoder switch 310 from being provided to the decoder switches.

The block-row decoder 300 further includes a voltage multiplexer 360 configured to provide one of a plurality of voltages as a select voltage VSEL to row decode logic 350. Which one of the plurality of voltages is based at least in part on a state of the BLKSEL signal. In the embodiment of FIG. 3 voltages VSAFE and VMAX may be provided as the VSEL voltage. The VSAFE voltage is less than the VMAX voltage. For example, in some embodiments the VSAFE voltage may be approximately 1-2 volts less than the VMAX voltage. In some embodiments, the VSAFE voltage may be even less than this range.

Operation of the block-row decoder 300 for a deselected condition will be described, that is, operation responsive to an inactive BLKSEL signal. The voltage translator 306 provides a 1DSEL signal having a voltage of VMAX to control the first decoder switch 310 to be open (e.g., non-conductive) responsive to the inactive BLKSEL signal. As a result, the second decoder switches 320 remain decoupled from the voltage provided to the input of the first decoder switch 310. Additionally, the voltage multiplexer 360 is controlled by the inactive BLKSEL signal to provide a VSEL voltage to the row decode logic 350 having the VSAFE voltage. As a result, the row decode logic 360 provides 2DSEL signals having a voltage of VSAFE to control the second decoder switches 320 to remain open (i.e., non-conductive). The row decode logic 360 further provides WLDSEL signals having the VSAFE voltage to control the word line drivers 340 to couple the respective WLs to the reference voltage. Coupling the WLs to the reference voltage causes the WLs to remain deselected.

By providing the second decoder switches 320 and the word line drivers 340 the 2DSEL and WLDSEL having the VSAFE voltage, the second decoder switches 320 and the third decoder switches 330 of the word line drivers 340 are not subjected to the higher voltage of VMAX while the block-row decoder is in a deselected state. As a result, voltage induced stress on the second and third decoder switches may be reduced in comparison to providing 2DSEL and WLDSEL signals having a higher voltage of VMAX. Reducing the stress on the second and third decoder switches 320, 330 for the deselected blocks of memory may improve failure rate, for example, for those memory failures related to transistor breakdown which may be promoted by voltage induced stress.

Figure 4:
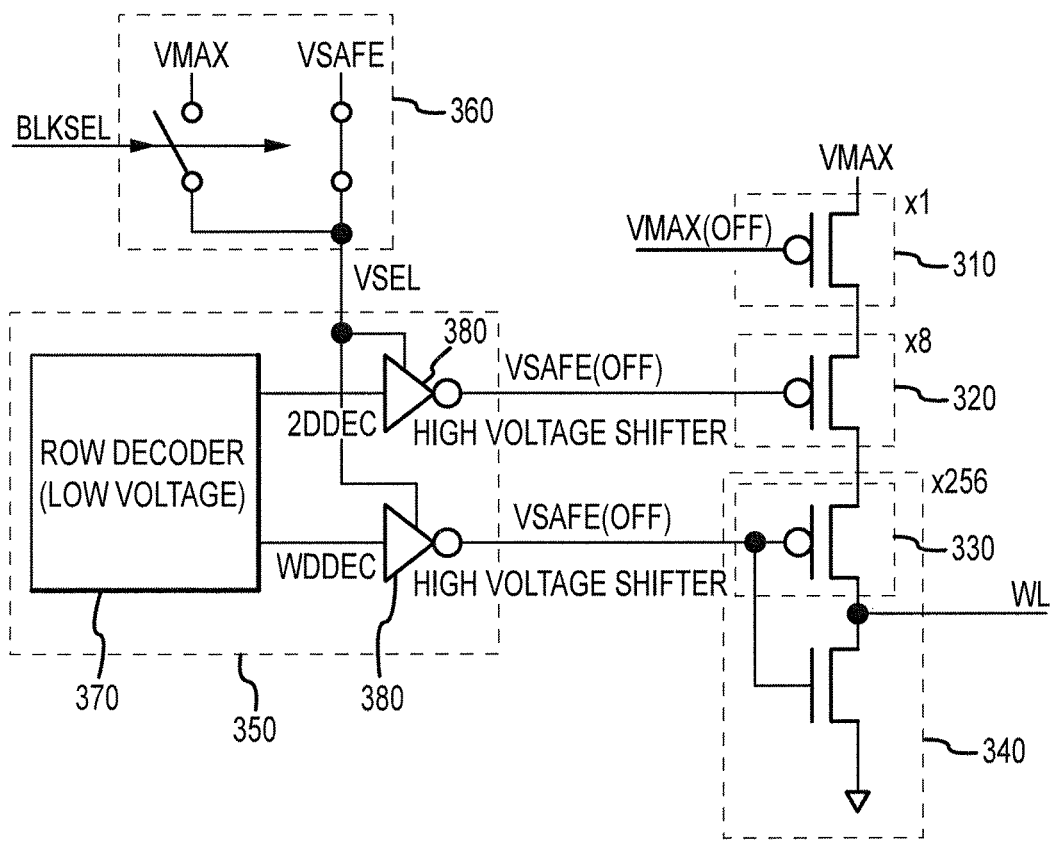
FIG. 4 is a schematic drawing of portions of a block-row decoder during operation according to an embodiment of the invention for a deselected block-row decoder.

FIG. 4 illustrates in simplified form portions of the block-row decoder 300 during operation for a deselected block of memory. An example decoder switch fanout of decoder switches 310, 320, and 330 is illustrated in FIG. 4 by the designation of "×1" for the first decoder switch 310, "×8" for the second decoder switch 320, and "×256" for the third decoder switch 330. That is, in the example fanout of FIG. 4, each block-row decoder includes one first decoder switch 310, which is coupled to eight second decoder switches 320, and each of the second decoder switches is coupled to 256 third decoder switches 330.

As illustrated in the example of FIG. 4, a voltage of VMAX is provided to the first decoder switch 310, and while the block-row decoder 300 is deselected a 1DSEL signal having a voltage of VMAX is provided to control the decoder switch 310 to remain open and thereby cut-off the VMAX voltage from being provided to inputs of any of the second decoder switches 320. Additionally, while the block-row decoder 300 is deselected the voltage multiplexer 360 is controlled to provide a VSEL voltage to the row decode logic 350 having the VSAFE voltage. As previously discussed, the VSAFE voltage is a voltage less than the VMAX voltage.

The VSEL (i.e., VSAFE) voltage is provided to voltage translators 380. The voltage translators 380 may be included in the row decode logic 350. The voltage translators 380 provide 2DSEL and WDSEL signals having the VSAFE voltage responsive to decode signals 2DDEC and WDDEC provided by row decoder 370, which may also be induced in the row decode logic 350. The 2DDEC and WDDEC signals have voltage levels that are relatively low in comparison to the VMAX and VSAFE voltages. The relatively low voltage decode signals are translated into the higher VSAFE voltage 2DSEL and WDSEL signals through the voltage translators 380. The 2DSEL and WDSEL signals control the respective decoder switches to remain open (i.e., non-conductive) to thereby cut-off the VMAX voltage from being provided through the second and third decoder switches 320, 330 to the WLs.

In the previous example a voltage of VSAFE was provided to the second decoder switches 320 and to the third decoder switches 330 while the block-row decoder 300 is deselected. In some embodiments, the voltage provided to the second and third decoder switches 320, 330 are different. For example, a voltage of VSAFE may be provided to only the second decoder switches 320 or to only the third decoder switches 330. In the latter example, the 2DSEL signals provided to the second decoder switches 320 may have the VMAX voltage and the WDSEL signals provided to the third decoder switches 330 may have the VSAFE voltage. In some embodiments, the different voltages that are applied to the second and third decoder switches 320, 330 while the block-row decoder 300 is deselected are both lower than the VMAX voltage. For example, the 2DSEL signals provided to the second decoder switches 320 may have a VSAFE voltage and the WDSEL signals provided to the third decoder switches 330 may have a different voltage. The different voltage provided to the third decoder switches 330 may be less than both the VMAX and VSAFE voltages.

As illustrated in the previous example, embodiments of the invention include applying decoder switch select signals (e.g., 2DSEL and WDSEL) while the block-row decoder is deselected that have voltages which are less than the voltage of the decoder switch select signal (e.g., 1DSEL) that controls whether a voltage provided to the block-row decoder is also provided to switches further down in the decoder switch tree, such as the second and third decoder switches 320, 330.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
    a first decoder switch configured to open responsive to receipt of a first decoder switch signal having a first voltage;
    a second decoder switch coupled to the first decoder switch, the second decoder switch configured to open responsive to a second decoder switch signal having a second voltage that is less than the first voltage;
    a third decoder switch coupled to the second decoder switch, wherein the third decoder switch is configured to open responsive to a third decoder switch signal having a third voltage that is less than the first voltage; and
    decode logic configured to provide the first decoder switch signal to the first decoder switch responsive to deselection of the decoder, the second decoder switch signal to the second decoder switch responsive to deselection of the decoder, and the third decoder switch signal to the third decoder switch responsive to deselection of the decoder.

2. The apparatus of claim 1, wherein the second voltage and the third voltage are different.

3. The apparatus of claim 1, wherein the second voltage and the third voltage are the same.

4. The apparatus of claims 1, wherein the decode logic is further configured to provide the third decoder switch signal to the third decoder switch responsive to deselection of the decoder.

5. The apparatus of claim 1, wherein the third decoder switch is included in a word line driver.

6. The apparatus of claim 5, wherein the word line driver is configured to couple a word line to a reference voltage responsive to the third decoder switch signal having the third voltage.

7. A method comprising:
    responsive to an inactive block select signal, providing a first voltage to block select switches of deselected ones of a plurality of block decoders to deactivate the block select switches;
    responsive to the inactive block select signal, providing a second voltage to decoder switches of deselected ones of the plurality of block decoders to deactivate the decoder switches, wherein the second voltage is less than the first voltage; and
    responsive to the inactive block select signal, providing a third voltage to additional decoder switches of deselected ones of the plurality of block decoders to deactivate the additional decoder switches, wherein the third voltage is less than the first voltage.

8. The method of claim 7, wherein the second voltage and the third voltage arc different.

9. The method of claim 7, wherein the second voltage and the third voltage are the same.

10. The method of claim 7, wherein providing the second voltage further comprises providing the second voltage from a voltage translator.

11. The method of claim 10, wherein the voltage translator provides the second voltage responsive to receiving the inactive block select signal.

12. An apparatus comprising:
    a block of memory; and
    a block decoder coupled to the block of memory, the block decoder having a decoder switch tree and configured to bias a block select switch of the decoder switch tree with a first voltage while the block decoder is deselected and further configured to bias decoder switches of the decoder switch tree that are coupled to the block select switch with a second voltage while the block decoder is deselected, wherein the second voltage is less than the first voltage, and wherein the block decoder is further configured to bias additional decoder switches of the decoder switch tree to an inactive state with a third voltage while the block decoder is deselected, wherein the third voltage is less than the first voltage.

13. The apparatus of claims 12, wherein the block decoder further comprises decode logic and a voltage multiplexer configured to selectively provide one of the first and second voltages to the decode logic.

14. The apparatus of claim 12, wherein the block decoder further comprises decode logic coupled to the additional decoder switches of the decoder switch tree, wherein the decode logic comprises:
   a decoder configured to provide a first decode signal having a voltage level lower than the first and third voltages; and
   a voltage translator coupled between the decoder and the additional decoder switches, wherein the voltage translator is configured to provide a second decode signal having the third voltage responsive to the first decode signal provided by the decoder.

15. The apparatus of claim 12, wherein the block decoder further comprises decode logic coupled to the decoder switches of the decoder switch tree, wherein the decode logic comprises:
   a decoder configured to provide a first decode signal having a voltage level lower than the first and second voltages; and
   a voltage translator coupled between the decoder and the decoder switches, wherein the voltage translator is configured to provide a second decode signal having the second voltage responsive to the first decode signal provided by the decoder.

16. The apparatus of claim 12, wherein the block decoder further comprises a voltage translator coupled to the block select switch, wherein the voltage translator is configured to bias the block select switch with the first voltage responsive to receiving an inactive block select signal.

\* \* \* \* \*